United States Patent [19]

Wu

[11] Patent Number: 6,008,079
[45] Date of Patent: Dec. 28, 1999

[54] METHOD FOR FORMING A HIGH DENSITY SHALLOW TRENCH CONTACTLESS NONVOLATILE MEMORY

[75] Inventor: Shye-Lin Wu, Hsinchu, Taiwan

[73] Assignee: Texas Instruments-Acer Incorporated, Hsinchu, Taiwan

[21] Appl. No.: 09/048,549

[22] Filed: Mar. 25, 1998

[51] Int. Cl.[6] ...................... H01L 21/338; H01L 21/8242
[52] U.S. Cl. .......................... 438/175; 438/211; 438/248; 438/257; 438/259; 438/262; 438/263; 438/27
[58] Field of Search ..................................... 438/175, 211, 438/212, 248, 257, 259, 262, 263, 264, 270, 288, 343, 638, 639, 672

[56] References Cited

U.S. PATENT DOCUMENTS

| | | |
|---|---|---|
| 5,423,973 | 6/1995 | Hong . |
| 5,480,819 | 1/1996 | Huang . |
| 5,521,110 | 5/1996 | Gill . |
| 5,554,568 | 9/1996 | Wen . |
| 5,661,055 | 8/1997 | Hsu et al. . |
| 5,680,345 | 10/1997 | Hsu et al. . |
| 5,744,847 | 4/1998 | Wen . |
| 5,763,310 | 6/1998 | Gardner . |
| 5,923,977 | 7/1999 | Ahmad et al. . |

OTHER PUBLICATIONS

Fiegna et al. "Scaling the MOS trnasistor below 0.1 microns: Methodology, device structures and technology requirements," IEEE Transactions on Electron Devices, vol. 41, No. 6, pp. 941–951, 1994.

Albert Bergemont et al., Low Voltage NVG™: A New High Performance 3 V/5 Flash Technology for Portable Computing and Telecommunications Applications, IEEE Transactions on Electron Devices, vol. 43, No. 9, Sep. 1996, pp. 1510–1517.

Paul–Henri Bricout et al., Short–Channel Effect Immunity and Current Capability of Sub–0.1–Micron MOSFET's Using a Recessed Channel, IEEE Transactions on Electron Devices, vol. 43, No. 8, Aug. 1996, pp. 1251–1255.

H. Shirai et al., A $0.54 \mu m^2$ Self–Aligned, HSG Floating Gate Cell (SAHF Cell) for 256Mbit Flash Memories, 1995 IEEE, pp. 653–656.

*Primary Examiner*—John F. Niebling
*Assistant Examiner*—Jonathan Hack
*Attorney, Agent, or Firm*—Harness, Dickey & Pierce, P.L.C.

[57] ABSTRACT

The present invention proposes a method for fabricating a high-density shallow trench contactless nonvolatile memory. First, a stacked pad oxide/silicon nitride layer is deposited on the substrate and the buried bit line region is defined by a photoresist. An anisotropic etching follows to etch the silicon layer and then the n+ impurity ions are implanted to form the source and drain. After stripping the photoresist, a high temperature steam oxidation process is used to grow a thick field oxide, and the doped ions are active and driven in to form the buried bit lines simultaneously. The silicon nitride layer and the pad oxide layer are then removed, and the silicon substrate is recessed by using the field oxide as an etching mask. After rounding the trench corners by using thermal oxidation and etching back processes, a thin silicon oxy-nitride film is regrown. An in-situ doped polysilicon film is deposited to refill the trench region and then etch back by using a CMP process to form the floating gates. Next, the interpoly dielectric such as ultra-thin ONO film, and, the control gate formed of n+ doped polysilicon film, are sequentially built. After the word lines are defined, the nonvolatile memory is thus finished.

21 Claims, 4 Drawing Sheets

METHOD FOR FORMING A HIGH DENSITY SHALLOW TRENCH CONTACTLESS NONVOLATILE MEMORY

BACKGROUND OF THE INVENTION

1. Field of the Invention

The present invention relates to a method for fabricating a nonvolatile memory, and more especially, to a method for fabricating high density shallow trench contactless nonvolatile memories.

2. Description of the Prior Art

Nonvolatile memories, including mask- read-only memories (Mask ROM), programmable ROM (PROM), erasable programmable ROM (EPROM), electrically erasable programmable ROM (EEPROM or $E^2$PROM) and flash memories, retain their memory data whenever the power is turned off, and have wide applications in the computer and electronic industry. In recent years, the portable computers and telecommunications market develop rapidly and become a major driving force in semiconductor integrated circuit's design and technology. As stated by A. Bergemont, et al., in "Low Voltage NVG™: A New High Performance 3 V/5 V Flash Technology for Portable Computing and Telecommunications Application" (in IEEE Trans. Electron Devices Vol. 43, p. 1510, 1996), it creates a great need for low power, high density, and electrically re-writable nonvolatile memories. That is, the memories programmable and erasable as EPROM, $E^2$PROM or flash memories are required for aforementioned systems to store operating systems or applications software. The basic storage cell of these programmable and erasable memories contain a double polysilicon storage transistor with a floating gate isolated in silicon dioxide and capacitively coupled to a second control gate which is stacked above it. The $E^2$PROM cell further comprises an access, or select, transistor. These memories execute the program and erasure by charging or discharging their floating gates. For example, the EPROM is programmed by hot electron injection at the drain to selectively charge the floating gate and erased by discharging the floating gate with ultraviolet light or X-ray, which the latter has never been commercially applied for this purpose. The $E^2$PROM and most of the flash memories are programmed by hot electron injection or cold electron tunneling named Flower-Nordheim tunneling, and erased mostly by Flower-Nordheim tunneling from the floating gate to the source, with the control gate ground. Herein the Flower-Nordheim tunneling, or cold electron tunneling, is a quantum-mechanical effect, which allows the electrons to pass through the energy barrier at the silicon-silicon dioxide interface at a lower energy than required to pass over it.

H. Shirai, et al., developed a method for fabricating 256 Mbit Flash memories with self-aligned, hemispherical grained polysilicon floating gate in their paper "A 0.54 $\mu m^2$ Self-Aligned, HSG Floating Gate Cell (SAHF Cell) for 256 Mbit Flash Memories" (in IEDM Tech. Dig. Vol. 95, p. 653, 1995). In this work, the hemispherical grained (HSG) polysilicon is applied to a floating gate to extend the upper surface area and double that of the floating gate in comparison with the conventional one. And, a high capacitive-coupling ratio of 0.8 and buried N+ diffusion layer which are self-aligned to the floating gate silicon, are realized. With contactless array and Flower-Nordheim program/erase scheme, a cell structure for achieving a high density and low power flash memory is proposed.

On the other hand, to achieve high density means to decrease the device dimensions, and it is accompanied with the problem of the short channel effect. The short channel effect may affect the electrical performance due to the reduction and degradation of the threshold voltage, that in turn increase the subthreshold current level and power dissipation. P. H. Bricout, et al., suggest in their article titled "Short-Channel Effect Immunity and Current Capability of Sub-0.1-Micron MOSFET's Using a Recessed Channel" in IEEE Trans. Electron Devices, Vol. 43, p. 1251, 1996, that the recessed channel structure nearly keeps the same threshold voltage for all channel length. This behavior is attribute to a "coupling" of the potential barrier created at both corners at the recessed floating gate. Due to this corner effect, the short channel effect can be suppressed by the appropriate geometry of the interface of the recessed channel. In addition, for equal noise margin, it is possible to use a lower concentration than in planar devices, and thus the degradation of the current device capability is limited. Furthermore, because the nonequilibrium transport is mainly located in the drain region, the magnitude of the hot carrier phenomena should be reduced compared to planar one.

SUMMARY OF THE INVENTION

A method for fabricating a high-density shallow trench contactless nonvolatile memory is disclosed. This method utilizes recessed floating gate structure to suppress the short channel effect. First, a stacked pad oxide/silicon nitride layer is deposited on the semiconductor substrate and the buried bit line region is defined by a photoresist using a standard photolithography process. An anisotropic etching follows to etch the silicon layer and then the n+ impurity ions are implanted to form the source and drain using the patterned photoresist as a mask. After stripping the photoresist, a high temperature steam oxidation process is used to grow a thick field oxide using the silicon nitride layer as a mask, and the doped ions are activated and driven in to form the buried bit lines simultaneously. The masking silicon nitride layer and the pad oxide layer are then removed, and the silicon substrate is recessed by using the field oxide as an etching mask. After rounding the trench corners by using thermal oxidation and etching back processes, a thin silicon oxynitride film is regrown over the substrate. An in-situ doped polysilicon film is deposited to refill the trench region and then etch back by using a CMP process to form the floating gates adjacent to the buried bit lines. Next, the interpoly dielectric such as ultra-thin ONO film, and, the control gate formed of n+ doped polysilicon film, are sequentially built. After the word lines are defined, the nonvolatile memory is thus finished.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a method to fabricate high-density shallow trench contactless nonvolatile memory. The method described here includes many process steps well known in the art like photolithography, etching or chemical vapor deposition (CVD) which are not discussed in detail. In addition, the present invention utilizes the recessed floating gate structure to suppress the short channel effect.

Figure 1:
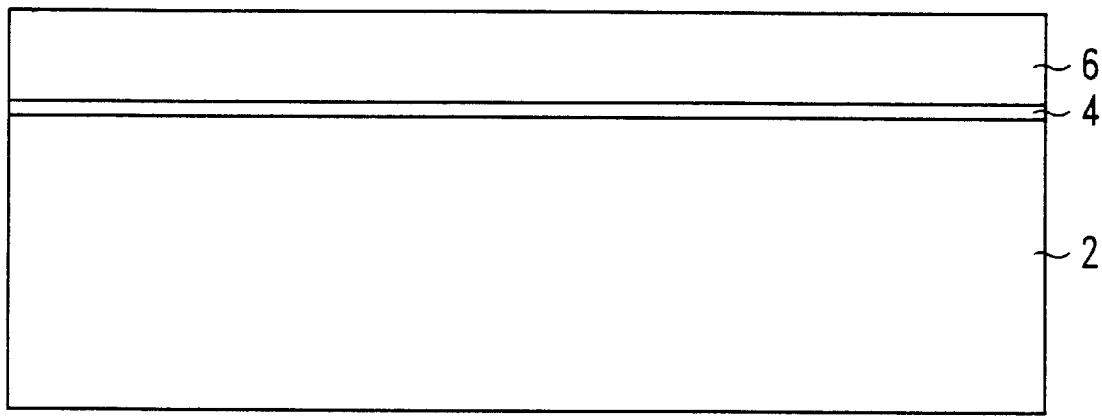
FIG. 1 is a cross-sectional view of a semiconductor wafer illustrating the step of forming a silicon oxide layer and a silicon nitride layer on the substrate according to the present invention.

Referring to FIG. 1, a single crystal silicon substrate 2 with a <100> crystallographic orientation is provided. A silicon oxide layer 4 is formed on the surface of the substrate 2 to serve as a pad oxide for the oxidation mask and as a sacrificial oxide for later ion implantation. The thickness of this pad oxide layer 4 is about 50–350 angstroms. The suitable method to formed the pad oxide layer 4 can be a thermal oxidation at a temperature of about 800–1100° C., or a low pressure chemical vapor deposition (LPCVD) at a temperature of about 400–800° C. Next, a thick silicon nitride layer 6 is deposited, for example, using a LPCVD process at a temperature of about 700–800° C., on the pad oxide layer 4. The silicon nitride layer 6 has a thickness of about 500–2500 angstroms, and serves as an oxidation mask while the field oxide is grown.

Figure 2:
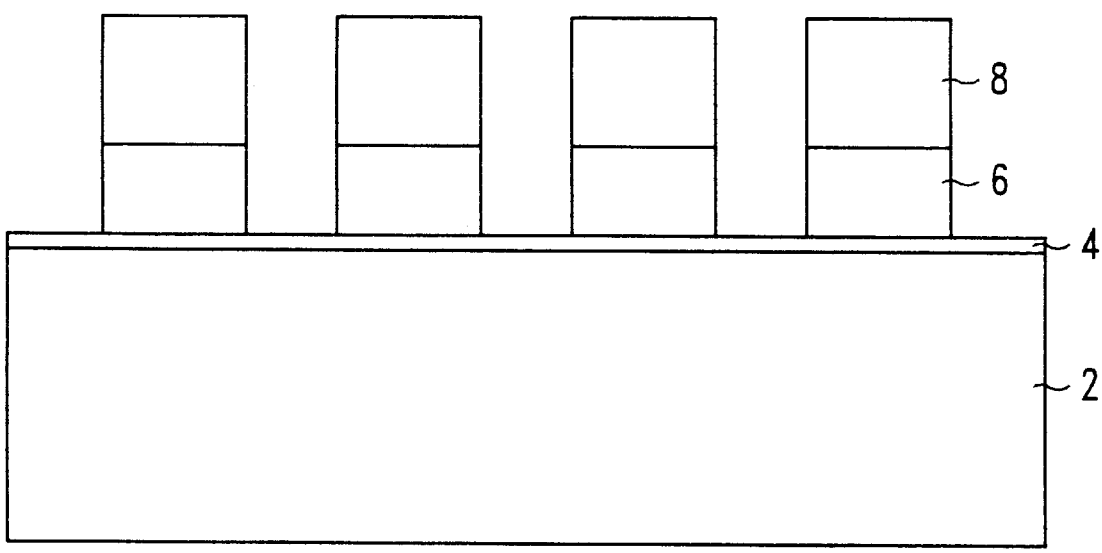
FIG. 2 is a cross-sectional view of a semiconductor wafer illustrating the step of defining the buried bit line regions on the substrate by patterning a photoresist and etching the silicon nitride layer according to the present invention.

Turning next to FIG. 2, a photoresist 8 with the pattern of buried bit lines is formed over the silicon nitride layer 6. This buried bit line pattern is defined by using a standard manner of photolithography including photoresist coating, exposure and development processes. An etching step follows to selectively etch the silicon nitride layer 6 and expose a portion of the pad oxide layer 4 which defines the buried bit line region on the substrate 2.

Figure 3:
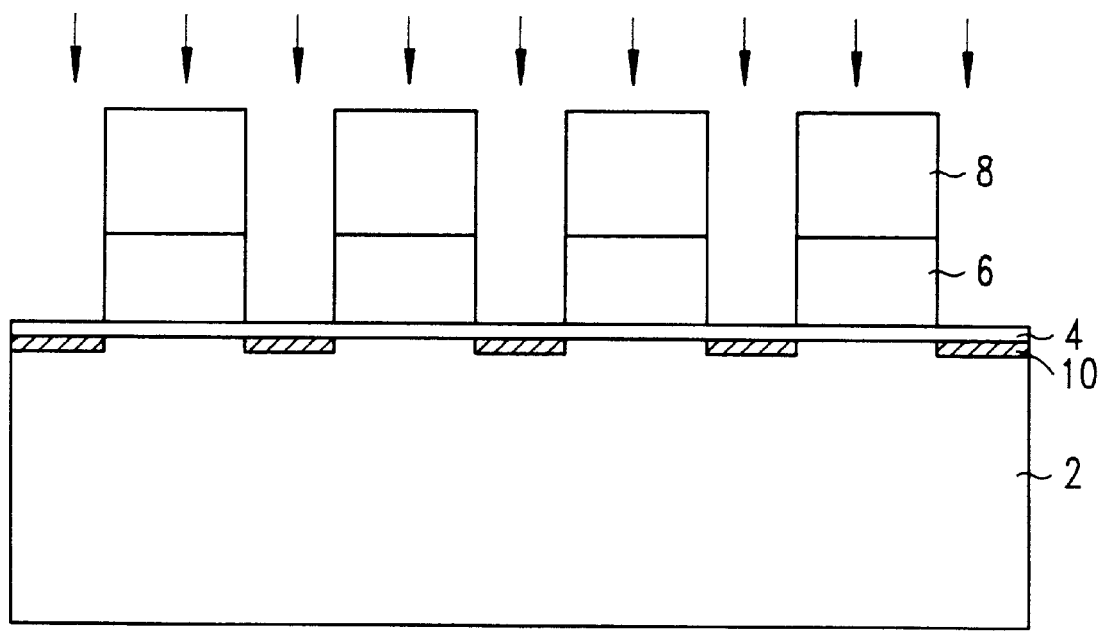
FIG. 3 is a cross-sectional view of a semiconductor wafer illustrating the step of performing a source/drain implantation according to the present invention.

Thereafter, an N+ source/drain implantation indicated by the arrows shown in FIG. 3 is performed to dope the appropriate impurity ions into the buried bit line region of the substrate 2 uncovered by the photoresist 8. The implanted ions can be phosphorus ions, arsenic ions or antimony ions. The doping energy used by this ion implantation is about 0.5–150 keV and the dosage is about $5 \times 10^{14}$–$5 \times 10^{16}$ atoms/cm$^2$.

Figure 4:
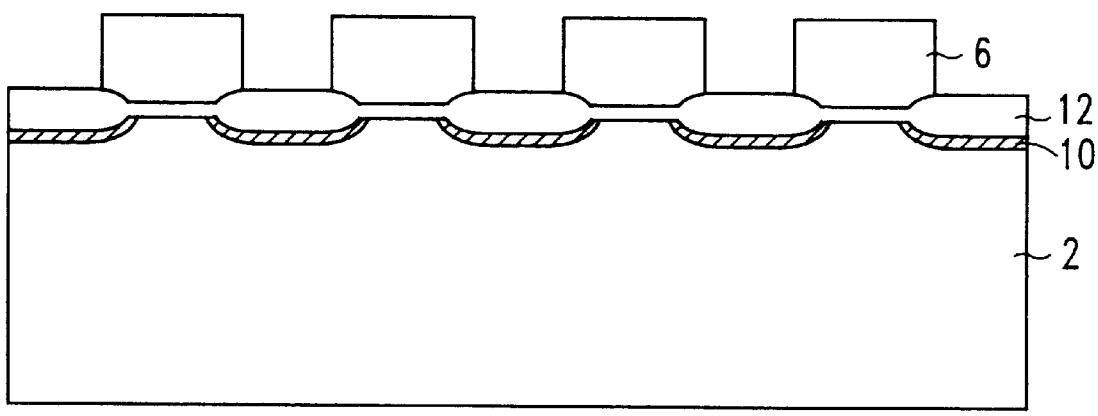
FIG. 4 is a cross-sectional view of a semiconductor wafer illustrating the step of growing a thick thermal oxide on the substrate according to the present invention.

Turning next to FIG. 4, after photoresist 8 is removed and wet cleaned, a high temperature steam oxidation is performed at about 800–1100° C. At this step, the thick field oxide regions 12 are grown with a thickness of about 500–5000 angstroms, and the dopants are activated and driven in to form the buried bit lines 10 simultaneously. In addition to the isolation between the floating gates, this thick field oxide layer 12 can be used as an etching mask while the shallow trenches are formed.

Figure 5:
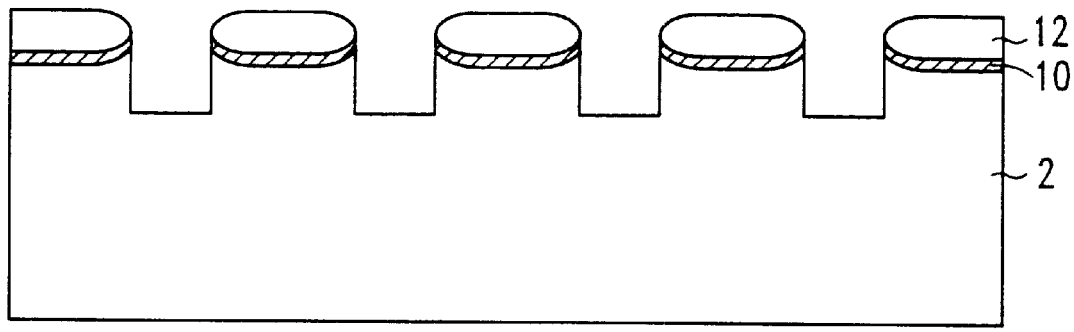
FIG. 5 is a cross-sectional view of a semiconductor wafer illustrating the step of recessing the silicon substrate to form shallow trench according to the present invention.

Next, as shown in FIG. 5, the residual silicon nitride layer 6 and the pad oxide layer 4 are removed to expose a portion of the substrate 2 using a suitable etching method. For example, the method using hot solution of phosphoric acid ($H_3PO_4$) as the etchant to etch the silicon nitride layer 6 and using diluted solution of hydrofluoric acid (HF) as the etchant to etch the pad oxide layer 4 is preferable. Thereafter, using the thick oxide layer 12 over the buried bit line as a hard mask, the substrate 2 is recessed to form shallow trenches by dry etching process. The etching gases containing both chlorine and fluorine have come to be preferred for this etching. It's because the chlorine plasma source such as $Cl_2$, $BCl_3$, or $SiCl_4$ gas exhibits excellent selectivity to silicon over silicon oxide and the fluorine plasma source such as $SF_6$ maintains the high etching rate.

Figure 6:
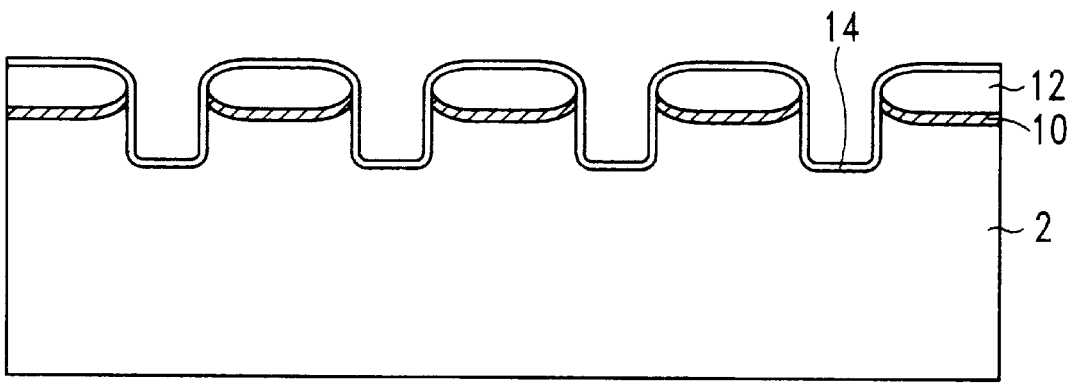
FIG. 6 is a cross-sectional view of a semiconductor wafer illustrating the step of rounding the trench corner and then growing a thin silicon oxy-nitride layer on the substrate according to the present invention.

Referring to FIG. 6, the trench corners are rounded by a thermal oxidation followed by an etching back process. The thermal oxidation is performed at a temperature of about 750–1150° C. in a dry or wet oxygen ambience. The suitable etchant of this wet etching can be buffered oxide-etching (BOE) solution or diluted solution of hydrofluoric acid (HF). Next, a thin silicon oxy-nitride layer 14 with the thickness of about 30–250 angstroms is regrown over the substrate 2 to provide the tunnel dielectric on the surface of the shallow trenches. This thin silicon oxy-nitride layer 14 can be formed by $N_2O$ or NO oxidation process. Alternatively, it can also be formed by depositing an ultra-thin silicon nitride film followed by a reoxidation process.

Figure 7:
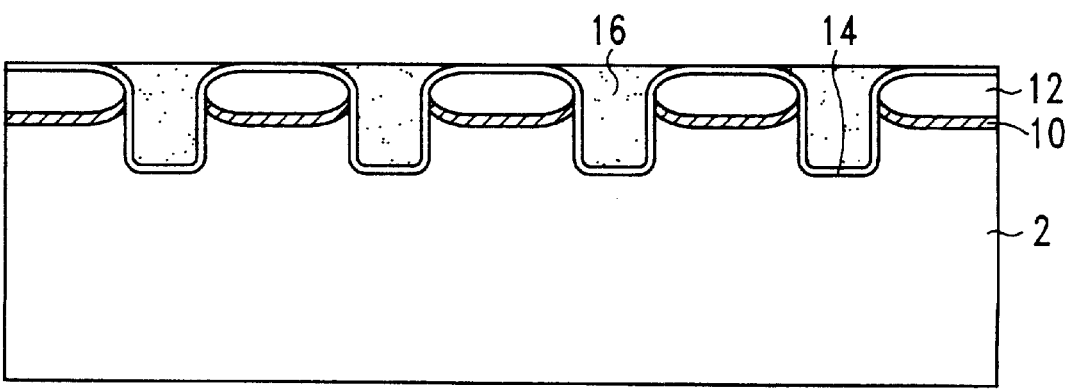
FIG. 7 is a cross-sectional view of a semiconductor wafer illustrating the step of depositing an n+ polysilicon into the shallow trench and etching back according to the present invention.

Next, referring to FIG. 7, the recessed floating gates 16 are formed of in-situ doped polysilicon by the next two steps. First, the material of in-situ doped polysilicon is deposited on the semiconductor substrate 2 to refill the trench region by using a conventional in-situ doped LPCVD at a temperature of about 400–620° C. Then, a portion of the in-situ doped polysilicon, which exceeds the trenches, is removed. A chemical mechanical polish (CMP) is proper for this process to strip the exceeding polysilicon because it can provide global planarization for the semiconductor substrate 2 at the same time. The portion of the silicon oxy-nitride layer 14 on the field oxide 12 serves as the stopping layer at the CMP process. Thus, the recessed floating gate region 16 adjacent to the buried bit lines is formed with the silicon oxynitride layer 14 as the tunnel dielectric.

Figure 8:
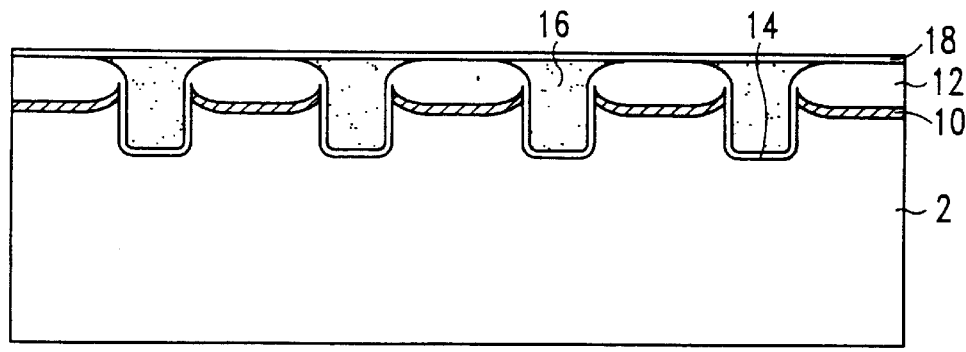
FIG. 8 is a cross-sectional view of a semiconductor wafer illustrating the step of forming an ultra-thin ONO film on n+ poly-Si film according to the present invention.

The ultra-thin interpoly dielectric (IPD) layer 18 deposited on the surface of the substrate 2 is now shown in FIG. 8. In general, this interpoly dielectric layer 18 can be a material of a double film of silicon nitride and silicon oxide, a triple film of silicon oxide, silicon nitride and silicon oxide (ONO), or any other high dielectric constant film such as tantalum pentoxide ($Ta_2O_5$) or BST.

Figure 9:
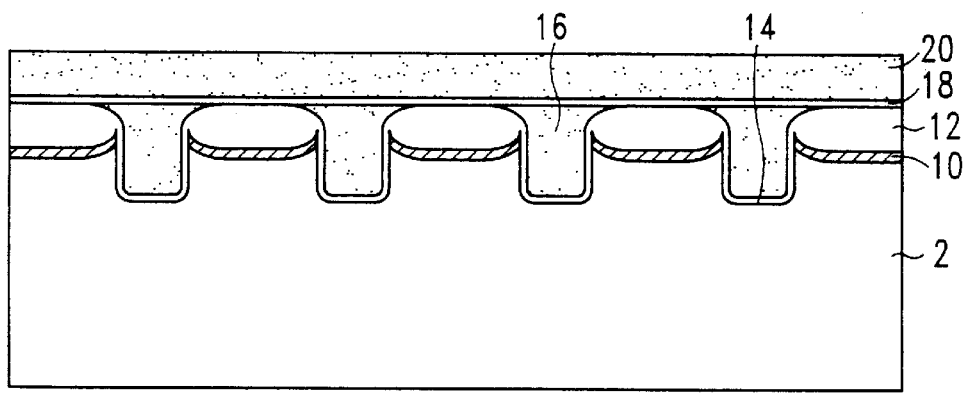
FIG. 9 is a cross-sectional view of a semiconductor wafer illustrating the step of depositing an n+ polysilicon film and then defining the word line according to the present invention.

Finally, referring to FIG. 9, another conductive layer 20 formed of doped or in-situ doped n+ polysilicon is deposited on the interpoly dielectric layer 18 to serve as the control gates. After patterning the conductor layer 20 to define the word lines, the high-density shallow trench contactless nonvolatile memory is finished according to the present invention.

Figure 10:
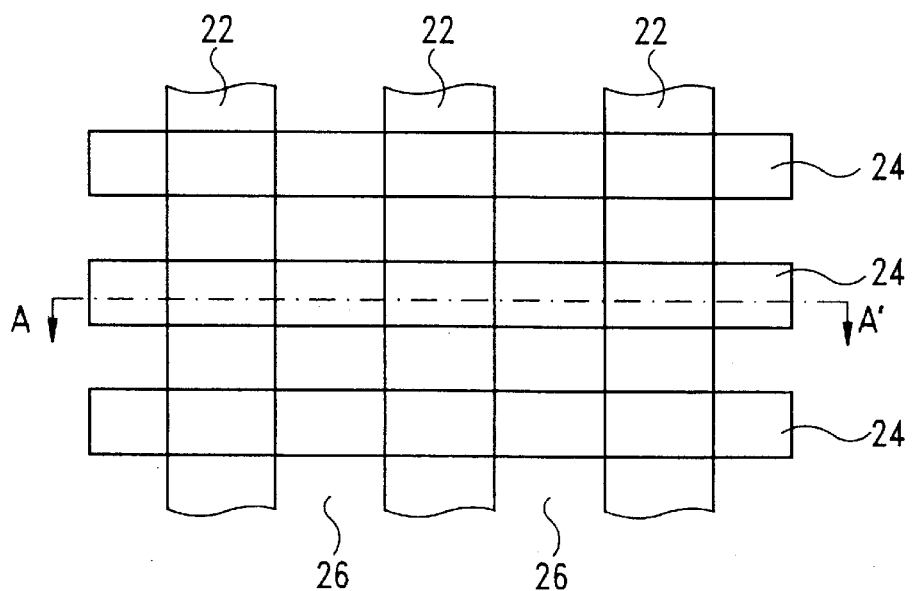
FIG. 10 is a top view of the high-density shallow trench contactless nonvolatile memory of the present invention.

FIG. 10 shows the top view of the high-density shallow trench contactless nonvolatile memory of the present invention. Regions 22 represent the trench floating gates. Regions 24 are the word lines, and the regions 26, which are adjacent to the trench gates 22, represent the buried bit line pattern. The AA' cross section is illustrated in FIG. 1 to FIG. 9 for the manufacturing formulation of the present nonvolatile memories.

The present invention provides a novel method to fabricate a nonvolatile memory with recessed floating gate structure. This recessed floating gate structure results in recessed tunnel dielectrics and recessed channels. Because of the larger area of the recessed tunnel dielectric than that of traditional structure, the programming and erasing speed of present invention will be much faster than traditional one. Also the recessed channel length is much longer than that of planar structure, then the short channel effect will be suppressed, and the device integration can be increased. Furthermore, because the floating gates is set under the wafer surface, the stacked control gates is easy to be planarized, and the periphery devices can be etched by the same mask using in the floating gate patterning.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming nonvolatile memories with trench gates, said method comprises:

forming a pad oxide layer on a semiconductor substrate;

forming a silicon nitride layer on said pad oxide layer;

patterning a photoresist on said silicon nitride layer to define the buried bit line region;

etching said silicon nitride layer to expose a portion of said pad oxide which defines said buried bit line region of said semiconductor substrate, said etching uses said patterned photoresist as an etching mask;

implanting ions into said semiconductor substrate to form source and drain using said patterned photoresist as an implantation mask;

removing said patterned photoresist;

performing a thermal oxidation to oxidize a potion of said semiconductor substrate exposed by said silicon nitride layer, thereby generating field oxides on said semiconductor substrate and simultaneously driving said ions into said semiconductor substrate;

removing said silicon nitride layer;

removing said pad oxide layer;

recessing said semiconductor substrate to form trenches in said semiconductor substrate using said field oxides as a mask;

forming a silicon oxy-nitride layer on said semiconductor substrate;

forming a first polysilicon layer on said semiconductor substrate and refilling into said trenches;

removing a portion of said first polysilicon layer which exceeds said trenches, whereby the residual portion of said first polysilicon layer forms the recessed floating gates isolated by said field oxide and said silicon oxy-nitride layer;

forming a dielectric layer on said semiconductor substrate;

forming a second polysilicon layer on said dielectric layer to serve as a control gate; and patterning said second polysilicon layer to form the word lines.

2. The method according to claim 1, wherein said semiconductor substrate is a p-type substrate.

3. The method according to claim 1, wherein said pad oxide layer has a thickness of about 50–350 angstroms.

4. The method according to claim 1, wherein said implanted ions are n-type ions selected from the group consisting of phosphorus ions, arsenic ions and antimony ions, and said ions are implanted at about 0.5–150 keV with dosage of about $5 \times 10^{14}$–$5 \times 10^{16}$ atoms/cm$^2$.

5. The method according to claim 1 further comprises a process for rounding the corners of said trenches before said silicon oxy-nitride layer is formed.

6. The method according to claim 5, wherein said trench corners is rounded by following method:

performing a thermal oxidation to grow a silicon oxide film on said semiconductor substrate; and removing said silicon oxide film.

7. The method according to claim 1, wherein said silicon oxy-nitride layer has a thickness of about 30–250 angstroms.

8. The method according to claim 1, wherein said first polysilicon layer is formed of in-situ n-type doped polysilicon.

9. The method according to claim 1, wherein said exceeding portion of said first polysilicon layer is removed by a chemical mechanical polish process using said silicon oxy-nitride layer as a stopping layer.

10. The method according to claim 1, wherein said dielectric layer is formed of the material selected from the group consisting of tantalum pentoxide ($Ta_2O_5$), BST, a double film of silicon nitride and silicon oxide, and a triple film of silicon oxide, silicon nitride and silicon oxide (ONO).

11. The method according to claim 1, wherein said second polysilicon layer is formed of n-type doped or in-situ n-type doped polysilicon.

12. A method for forming nonvolatile memories with trench gates, said method comprises:

forming a pad oxide layer on a semiconductor substrate;

forming a silicon nitride layer on said pad oxide layer;

patterning a photoresist on said silicon nitride layer to define the buried bit line region;

etching said silicon nitride layer to expose a portion of said pad oxide which defines said buried bit line region of said semiconductor substrate, said etching uses said patterned photoresist as an etching mask;

implanting ions into said semiconductor substrate to form source and drain using said patterned photoresist as an implantation mask;

removing said patterned photoresist;

performing a thermal oxidation to oxidize a potion of said semiconductor substrate exposed by said silicon nitride layer, thereby generating field oxides on said semiconductor substrate and simultaneously driving said ions into said semiconductor substrate;

removing said silicon nitride layer;

removing said pad oxide layer;

recessing said semiconductor substrate to form trenches in said semiconductor substrate using said field oxides as a mask;

rounding the corners of said trenches;

forming a silicon oxy-nitride layer on said semiconductor substrate;

forming a first polysilicon layer on said semiconductor substrate and refilling into said trenches;

removing a portion of said first polysilicon layer which exceeds said trenches, whereby the residual portion of said first polysilicon layer forms the recessed floating gates isolated by said field oxide and said silicon oxy-nitride layer;

forming a dielectric layer on said semiconductor substrate;

forming a second polysilicon layer on said dielectric layer to serve as a control gate; and patterning said second polysilicon layer to form the word lines.

13. The method according to claim 12, wherein said semiconductor substrate is a p-type substrate.

14. The method according to claim 13, wherein said pad oxide layer has a thickness of about 50–350 angstroms.

15. The method according to claim 12, wherein said implanted ions are n-type ions selected from the group consisting of phosphorus ions, arsenic ions and antimony ions, and said ions are implanted at about 0.5–150 keV with dosage of about $5 \times 10^{14}$–$5 \times 10^{16}$ atoms/cm$^2$.

16. The method according to claim 12, wherein said trench corners is rounded by following method:

performing a thermal oxidation to grow a silicon oxide film on said semiconductor substrate; and removing said silicon oxide film.

17. The method according to claim 12, wherein said silicon oxy-nitride layer has a thickness of about 30–250 angstroms.

18. The method according to claim 12, wherein said first polysilicon layer is formed of in-situ n-type doped polysilicon.

19. The method according to claim 12, wherein said exceeding portion of said first polysilicon layer is removed by a chemical mechanical polish process using said silicon oxy-nitride layer as a stopping layer.

20. The method according to claim 12, wherein said dielectric layer is formed of the material selected from the group consisting of tantalum pentoxide (Ta$_2$O$_5$), BST, a double film of silicon nitride and silicon oxide, and a triple film of silicon oxide, silicon nitride and silicon oxide (ONO).

21. The method according to claim 12, wherein said second polysilicon layer is formed of n-type doped or in-situ n-type doped polysilicon.

* * * * *